(12) United States Patent
He

(10) Patent No.: US 11,626,542 B2
(45) Date of Patent: Apr. 11, 2023

(54) LED BRACKET

(71) Applicant: GANZHOU HESHENG PRECISION ELECTRONICS CO., LTD., Ganzhou (CN)

(72) Inventor: Yaoquan He, Ganzhou (CN)

(73) Assignee: GANZHOU HESHENG PRECISION ELECTRONICS CO., LTD., Ganzhou (CN)

( * ) Notice: Subject to any disclaimer, the term of this patent is extended or adjusted under 35 U.S.C. 154(b) by 0 days.

(21) Appl. No.: 17/583,451

(22) Filed: Jan. 25, 2022

(65) Prior Publication Data
US 2022/0238762 A1  Jul. 28, 2022

(30) Foreign Application Priority Data
Jan. 25, 2021  (CN) .......................... 202110099265.1

(51) Int. Cl.
*H01L 33/48* (2010.01)
*H01L 33/50* (2010.01)
*H01L 33/52* (2010.01)

(52) U.S. Cl.
CPC .......... *H01L 33/483* (2013.01); *H01L 33/507* (2013.01); *H01L 33/52* (2013.01)

(58) Field of Classification Search
CPC ................... H01L 33/507; H01L 33/52; H01L 33/483–486; H01L 2933/0033
See application file for complete search history.

(56) References Cited

U.S. PATENT DOCUMENTS

| | | | |
|---|---|---|---|
| 2002/0074953 A1* | 6/2002 | Lovell | H05B 41/2821 315/291 |
| 2012/0086039 A1* | 4/2012 | Won | H01L 33/58 257/E33.061 |

* cited by examiner

*Primary Examiner* — Jay C Chang
*Assistant Examiner* — Mikka Liu
(74) *Attorney, Agent, or Firm* — Hogan Lovells US LLP

(57) ABSTRACT

The present disclosure discloses an LED bracket, including: a front bracket, wherein an LED lamp chip is provided in the front bracket; and a back bracket, wherein the back bracket is connected to the front bracket, and a diffusion material is provided on a side of the back bracket away from the front bracket, wherein the LED lamp chip can emit light from the front bracket and light emitted from a direction close to the back bracket passes through the diffusion material and then goes out from the back bracket. In the present disclosure, the front bracket is provided, the back bracket is additionally provided on the front bracket, the diffusion material is provided on the back bracket.

19 Claims, 3 Drawing Sheets

LED BRACKET

CROSS-REFERENCE TO RELATED APPLICATION

The present disclosure claims the priority to the Chinese patent application with the filing No. 2021100992651 filed on Jan. 25, 2021 with the Chinese Patent Office, and entitled "LED Bracket", the contents of which are incorporated herein by reference in entirety.

TECHNICAL FIELD

The present disclosure relates to the technical field of LED, in particular to an LED bracket.

BACKGROUND ART

An LED (Light Emitting Diode) lamp bead is a solid semiconductor device, and it can directly convert electric energy into optical energy. As the LED lamp bead is easily damaged by an external extruding force, a common practice is to place the LED lamp bead on an LED bracket, to protect the LED lamp bead by the LED bracket, so as to satisfy the requirements of mounting and protecting the LED lamp bead.

A front surface and a back surface of the existing lamp bead brackets are both provided in a plane shape. The front surface of the lamp bead bracket is provided with a weld leg and a die bond bonding wire, and then an encapsulation glue is applied in a front bracket cup, and after the encapsulation glue is dried, an LED lamp bead is formed. A light-emitting angle of the LED lamp bead is only 120°, and even if the bracket is made of a transparent material, light can be transmitted to the back surface through a small slot in the middle, and the light emitted is still very weak, and is quite different from that emitted from the front surface.

SUMMARY

Objectives of the embodiments of the present disclosure include, for example, providing an LED bracket, aiming at solving the problems that the light-emitting angle of the LED lamp bead is only 120°, and that light from the back surface of the bracket of the lamp bead is very weak and is quite different from that from the front surface.

In order to achieve the above objectives, the present disclosure adopts the following technical solution.

An LED bracket is provided, including:

a front bracket, wherein an LED lamp chip is provided in the front bracket; and a back bracket, wherein the back bracket is connected to the front bracket, and a diffusion material is provided on a side of the back bracket away from the front bracket.

In the above, the LED lamp chip can emit light from the front bracket and light emitted in a direction close to the back bracket passes through the diffusion material and then emits from the back bracket.

In one or more embodiments, the front bracket has two ends provided opposite to each other, the front bracket is provided with a mounting station, the LED lamp chip is encapsulated on the mounting station by an encapsulation glue, and light emitted from the LED lamp chip can emit from two ends, provided opposite to each other, of the front bracket.

In one or more embodiments, the back bracket is connected to the front bracket in a direction parallel to the front bracket, and an outer diameter of the back bracket is not greater than an outer diameter of the front bracket, both left and right ends of the back bracket can be flush with both left and right ends of the front bracket, and length of upper end and lower end of the back bracket is less than length of upper end and lower end of the front bracket.

By providing the back bracket, and providing the diffusion material on the back bracket, light emitted from the LED lamp chip close to the back bracket can be diffused through the diffusion material, and effect of light emitted from the back bracket is not quite different from effect of light emitted from the front bracket, thus achieving the characteristic of increasing the light effect of the LED lamp chip on the back bracket.

In one or more embodiments, the back bracket is provided with a filling station, and the diffusion material is filled in the filling station.

In one or more embodiments, the front bracket is provided with a mounting groove, the mounting groove is recessed in a direction close to the back bracket, and the LED lamp chip is provided in the mounting groove.

In one or more embodiments, the mounting station comprises the mounting groove, and the mounting groove penetrates through two ends, arranged opposite to each other, of the front bracket.

In one or more embodiments, a receiving area of the mounting groove is greater than an area of the LED lamp chip.

By disposing the LED lamp chip in the mounting groove, the LED lamp chip can be isolated from the outside, thus ensuring the normal operation of the LED lamp chip.

In one or more embodiments, the front bracket is further provided with a light-transmitting layer, the light-transmitting layer is arranged corresponding to the mounting groove, and light of the LED lamp chip can pass through the light-transmitting layer and emit from the back bracket, thus ensuring that after passing through the diffusion material, the light emitted from the back bracket is not quite different from the light emitted from the front bracket.

In one or more embodiments, the light-transmitting layer is made of the same material as the front bracket, and an end portion of the light-transmitting layer and the front bracket are integrally molded.

In one or more embodiments, the material of the light-transmitting layer may be a light-transmitting material such as PC, PP, and polymethyl methacrylate.

In one or more embodiments, the back bracket is provided with a groove, the groove is recessed in a direction close to the front bracket, and the diffusion material is provided in the groove. The diffusion material has the function of increasing the light effect.

In one or more embodiments, the filling station comprises the groove, the groove is disposed in a middle position of the back bracket, and the groove penetrates through two opposite ends of the back bracket, so that the light-transmitting layer can traverse the groove.

In one or more embodiments, the diffusion material is filled in the groove, and the diffusion material fills the groove to be flush with an end surface of the back bracket away from the front bracket.

In one or more embodiments, a substrate is further included, wherein two substrates are provided, the two substrates are provided at intervals, and end portions of the two substrates arranged at intervals are covered by the light-transmitting layer, end portions of the substrates away from the light-transmitting layer are protrudingly provided on the front bracket in a direction parallel to the back bracket, and the end portions of the substrates are each provided with a weld leg.

In one or more embodiments, the two substrates are distributed vertically and arranged on the front bracket at intervals, and light emitted from the LED lamp chip close to the back bracket can pass through a gap between the two substrates.

In one or more embodiments, the LED lamp chip is welded onto the substrate, and the LED lamp chip is encapsulated in the mounting groove by an encapsulation glue.

In one or more embodiments, a matching groove is provided on a side of the front bracket close to the back bracket, the matching groove is recessed in a direction away from the back bracket, and the substrate is snapped in the matching groove. The matching groove can function to limit the position of the substrates to a certain extent.

In one or more embodiments, an end portion of the matching groove is provided with a protrusion, and the protrusion is provided in a mounting hole of the substrate, so that the substrate is snapped in the matching groove, and the substrate does not easily fall off when being subjected to an external force or a high temperature.

In one or more embodiments, the LED bracket covers the substrate, and the LED bracket forms the matching groove that is snapped with the substrate.

In one or more embodiments, the two substrates are each provided with the mounting hole, and the mounting holes penetrate through the substrates along the thickness direction of the substrates, the LED bracket is provided with the protrusion correspondingly matched and connected with the mounting holes, the protrusion and the front bracket are integrally molded, and the material adopted by the protrusion may be consistent with the material of the LED bracket.

In one or more embodiments, the diffusion material comprises fluorescent powder or encapsulation glue.

In one or more embodiments, the front bracket and the back bracket are integrally molded, and the front bracket and the back bracket are injection-molded with the same material, thus ensuring that the front bracket and the back bracket are more easily integrally molded.

Compared with the prior art, the present disclosure has the following beneficial effects: in the present disclosure, the front bracket is provided, the back bracket is additionally provided on the front bracket, the diffusion material is provided on the back bracket, when the lamp bead is provided on the front bracket, light emitted from the LED lamp chip close to the back bracket can be diffused through the diffusion material, so that effect of light emitted from the back bracket is not quite different from effect of light emitted from the front bracket, thus achieving the characteristic of increasing the light effect of the LED lamp chip on the back bracket.

BRIEF DESCRIPTION OF DRAWINGS

The present disclosure is further described in detail below according to the accompanying drawings and the embodiments.

In the drawings.

Figure 1:
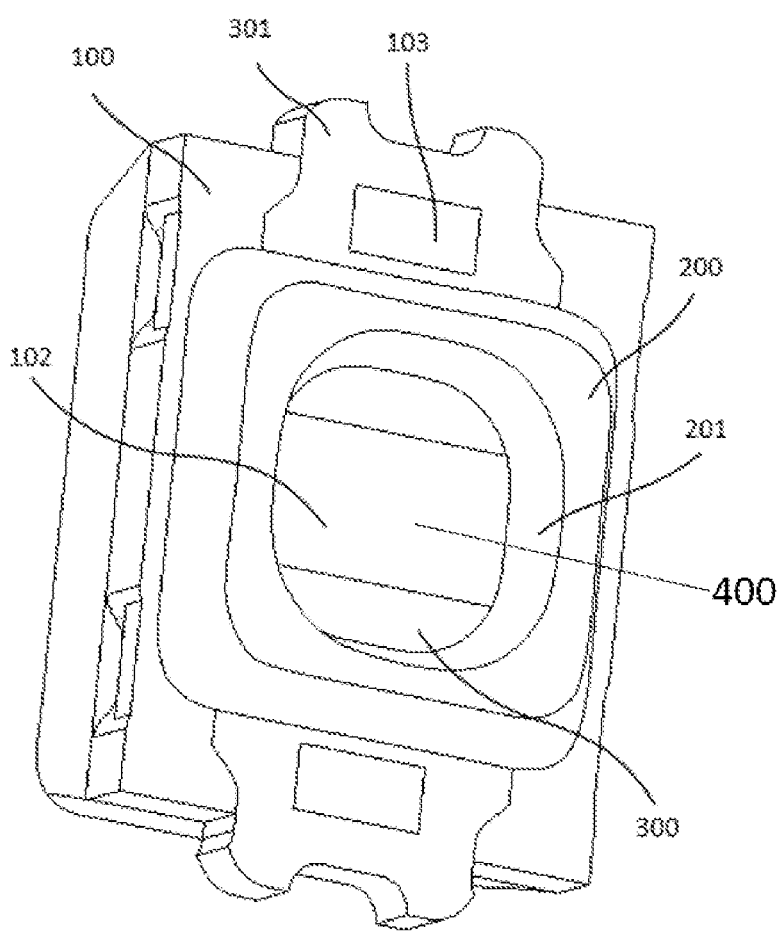
FIG. 1 is a perspective structural schematic view of an LED bracket in an embodiment of the present disclosure.

100. front bracket; 101. mounting groove; 102. light-transmitting layer; 103. protrusion; 200. back bracket; 201. groove; 300. substrate; 301. weld leg; 400. diffusion material; 500. LED lamp chip.

DETAILED DESCRIPTION OF EMBODIMENTS

In order to make the technical problems to be solved by the present disclosure, the technical solutions used, and the technical effects achieved clearer, the technical solutions in the embodiments of the present disclosure are further described in detail below, and apparently, some but not all embodiments of the present disclosure are described. Based on the embodiments of the present disclosure, all of other embodiments obtained by those skilled in the art without any creative effort shall fall within the scope of protection of the present disclosure.

In the description of the present disclosure, unless otherwise specified and defined explicitly, terms "join", "connect", and "fix" should be construed in a broad sense, for example, a connection may be a fixed connection, a detachable connection, or an integral connection; it may be a mechanical connection, and also may be an electrical connection; it may be a direct connection, an indirect connection via an intermediary, or internal communication between two elements or interaction between two elements. For a person ordinarily skilled in the art, specific meanings of the above-mentioned terms in the present disclosure could be understood according to specific circumstances.

A front surface and a back surface of the existing lamp bead brackets are both provided in a plane shape. The front surface of the lamp bead bracket is provided with a weld leg 301 and a die bond bonding wire, and then an encapsulation glue is applied in a front bracket 100, and after the encapsulation glue is dried, an LED lamp bead is formed. A light-emitting angle of the LED lamp bead is only 120°, and even if the bracket is made of a transparent material, light can be transmitted to the back surface through a small slot in the middle, and the light emitted is still very weak, and is quite different from that emitted from the front surface.

The present disclosure provides an LED bracket, which is provided with a front bracket 100, and a back bracket 200 is additionally provided on the front bracket 100. The back bracket 200 is provided with a diffusion material 400, and when a lamp bead is provided on the front bracket 100, light emitted from an LED lamp chip 500 close to the back bracket 200 can be diffused through the diffusion material 400, so that effect of light emitted from the back bracket 200 is not quite different from effect of light emitted from the front bracket 100, thus achieving the characteristic of increasing the light effect of the LED lamp chip 500 on the back bracket 200.

Figure 2:
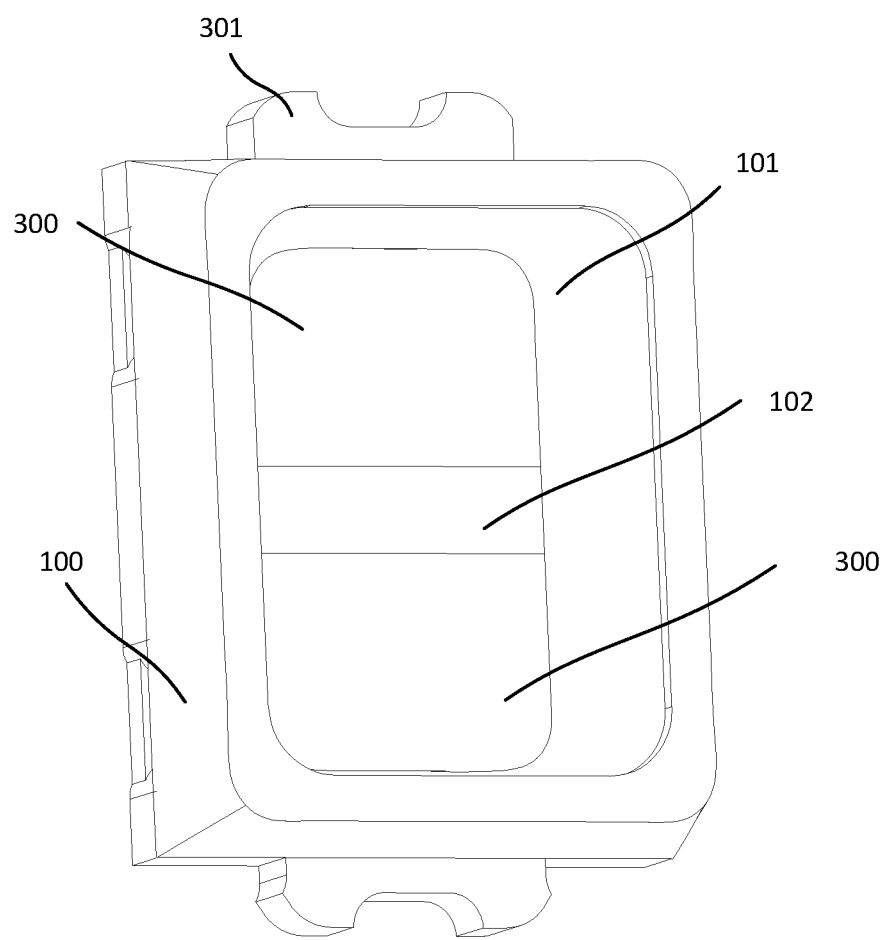
FIG. 2 is a structural schematic view of the LED bracket in an embodiment of the present disclosure from another view angle.
Figure 3:
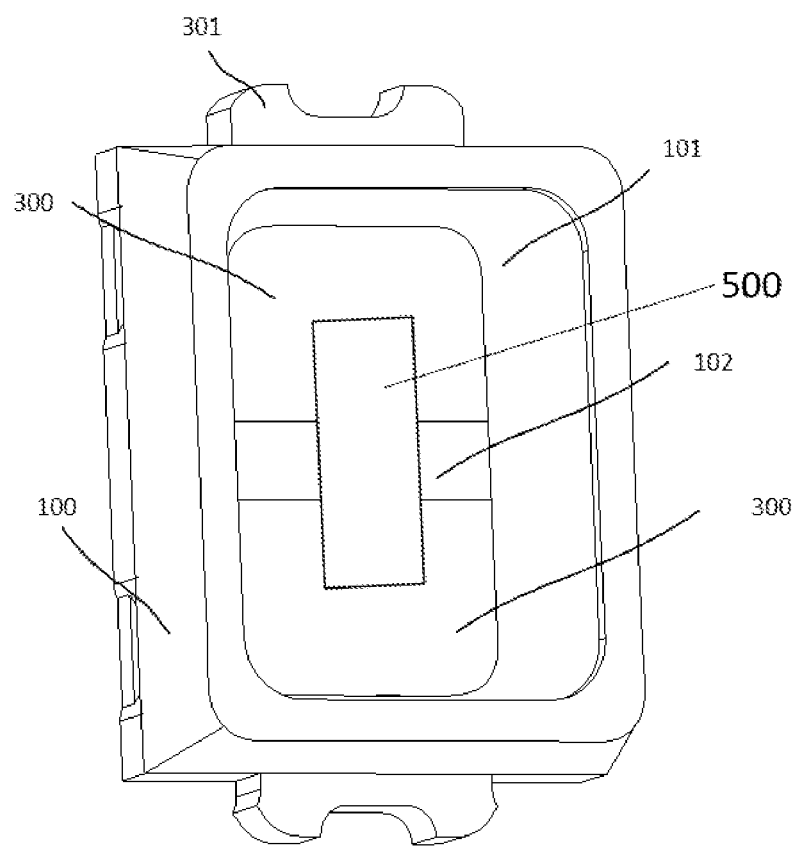
FIG. 3 is a structural schematic view of the LED bracket with an LED lamp chip mounted therein in an embodiment of the present disclosure.

In the present disclosure, FIG. 1 is a perspective structural schematic view of the LED bracket, and FIG. 2 is a structural schematic view of the LED bracket from another view angle.

As shown in FIG. 1, the present embodiment provides an LED bracket, including:

a front bracket 100, wherein an LED lamp chip 500 is provided in the front bracket 100; and a back bracket 200, wherein the back bracket 200 is connected to the front bracket 100, and a diffusion material 400 is provided on a side of the back bracket 200 away from the front bracket 100.

In the above, the LED lamp chip 500 can emit light from the front bracket 100 and light emitted in a direction close to the back bracket 200 passes through the diffusion material 400 and then goes out from the back bracket 200.

It can be understood that the front bracket 100 has two ends provided opposite to each other, the front bracket 100 is provided with a mounting station, and the LED lamp chip 500 is encapsulated on the mounting station, for example, encapsulated on the mounting station by the encapsulation glue, and a specific encapsulating manner is not limited herein. Moreover, the light emitted from the LED lamp chip 500 is emitted from the front bracket 100, and preferably, the light emitted from the LED lamp chip 500 can go out from two opposite ends of the front bracket 100.

In an embodiment, the back bracket 200 is connected to the front bracket 100 in a direction parallel to the front bracket 100, and an outer diameter of the back bracket 200 is not greater than an outer diameter of the front bracket 100, as shown in FIG. 1, both left and right ends of the back bracket 200 may be flush with both left and right ends of the front bracket 100, and length of upper end to lower end of the back bracket 200 is less than length of upper end to lower end of the front bracket 100.

It should be noted that the back bracket 200 is provided with a filling station, and the diffusion material 400 is filled in the filling station, so that the light effect of light emitted by the LED lamp chip 500 from a direction close to the back bracket 200 can be increased through the diffusion material 400.

In one or more embodiments, the front bracket 100 is provided with a mounting groove 101, the mounting groove 101 is recessed in a direction close to the back bracket 200, and the LED lamp chip 500 is provided in the mounting groove 101.

Specifically, the mounting station comprises the mounting groove 101, and the mounting groove 101 penetrates through two opposite ends of the front bracket 100, so that the LED lamp chip 500 can emit light from various positions of the front bracket 100.

It can be understood that a receiving area of the mounting groove 101 is greater than an area of the LED lamp chip 500, so that the LED lamp chip 500, when being disposed in the mounting groove 101, is encapsulated and then dried, to form the LED lamp bead. The above encapsulation may be carried out with the encapsulation glue, which is not limited in the present disclosure.

In the present disclosure, the front bracket 100 is further provided with a light-transmitting layer 102, the light-transmitting layer 102 is arranged corresponding to the mounting groove 101, and light of the LED lamp chip 500 can pass through the light-transmitting layer 102 and go out from the back bracket 200.

Preferably, the light-transmitting layer 102 is made of the same material as the front bracket 100, and an end portion of the light-transmitting layer 102 is connected to the front bracket 100, so that light emitted from the LED lamp chip 500 can pass through the light-transmitting layer 102. A connecting manner of the end portion of the light-transmitting layer 102 and the front bracket 100 comprises, but is not limited to, a detachable connection and a non-detachable connection, and preferably, the end portion of the light-transmitting layer 102 and the front bracket 100 may be integrally molded.

A person ordinarily skilled in the art could understand that the light-transmitting layer 102 may also be made of a material different from the front bracket 100, which is not limited in the present disclosure.

It can be understood that the material of the light-transmitting layer 102 may be a light-transmitting material such as PC, PP, and polymethyl methacrylate, and in the present disclosure, polymethyl methacrylate is preferably used as the material for manufacturing the light-transmitting layer 102.

In one or more embodiments, the back bracket 200 is provided with a groove 201, the groove 201 is recessed in a direction close to the front bracket 100, and the diffusion material 400 is provided in the groove 201.

As shown in FIG. 2, in the present disclosure, the filling station comprises the groove 201, and the groove 201 is disposed on the back bracket 200.

Preferably, the groove 201 is disposed in a middle position of the back bracket 200, and the groove 201 penetrates through two opposite ends of the back bracket 200, so that the light-transmitting layer 102 can traverse the groove 201.

Exemplarily, the diffusion material 400 is filled in the groove 201, and the diffusion material 400 fills the groove 201 to be flush with an end surface of the back bracket 200 away from the front bracket 100, so that light of the LED lamp chip 500 passing through the light-transmitting layer 102 can be better diffused through the diffusion material 400.

In the present disclosure, a substrate 300 is further included. Two substrates 300 are provided, the two substrates 300 are provided at intervals, and end portions of the two substrates 300 arranged at intervals are covered by the light-transmitting layer 102. End portions of the substrates 300 away from the light-transmitting layer 102 are protrudingly provided on the front bracket 100. Preferably, the end portions of the substrates 300 away from the light-transmitting layer 102 are protrudingly provided on the front bracket 100 in a direction parallel to the back bracket 200, and the end portions of the substrates 300 are each provided with a weld leg 301.

As shown in FIG. 1, the two substrates 300 are distributed vertically and arranged on the front bracket 100 at intervals, and light emitted from the LED lamp chip 500 close to the back bracket 200 can pass through a gap between the two substrates 300; and in a preferred solution of the present disclosure, vertical center lines of the two substrates 300 are overlapped with each other.

It can be understood that the two substrates 300, through mating and connection with the light-transmitting layer 102, can cover the mounting groove 101 and also can cover the groove 201, and light emitted from the LED lamp chip 500 passes through the light-transmitting layer 102.

The end portions of the two substrates 300 away from the light-transmitting layer 102 are both provided with the weld leg 301. The weld legs 301 are firmer, and do not easily fall off when being subjected to a high temperature; moreover, the substrates 300 are inlaid on the LED bracket, so that the substrates 300 and the LED bracket will not deform and fall off due to a small external force when the production product is subjected to a high temperature.

In one or more embodiments, the LED lamp chip 500 is welded onto the substrate 300, and the LED lamp chip 500 is encapsulated in the mounting groove 101 by the encapsulation glue.

Specifically, the LED chip is first welded onto the substrate 300, and then the LED lamp chip 500 is isolated from the outside through encapsulation, and dried to form an LED lamp bead. The foregoing encapsulation method may be, for example, encapsulation with the encapsulation glue, and without doubt, other encapsulation methods may also be used, which is not limited in the present disclosure.

In the present disclosure, a matching groove is provided on a side of the front bracket 100 close to the back bracket 200, the matching groove is recessed in a direction away from the back bracket 200, and the substrate 300 is snapped in the matching groove; an end portion of the matching groove is provided with a protrusion 103, and the protrusion 103 is provided in the mounting hole of the substrate 300, so that the substrate 300 is snapped in the matching groove.

It can be understood that, in order to prevent the substrate 300 and the LED bracket from easily falling off, the LED bracket is covered on the substrate 300, and the LED bracket forms the matching groove that is clamped with the substrate.

Meanwhile, the two substrates 300 are each provided with the mounting hole, and the mounting holes penetrate through the substrates 300 along the thickness direction of the substrates 300, the LED bracket is provided with the protrusion 103, and the protrusion 103 is correspondingly matched and connected with the mounting holes, the protrusion 103 and the front bracket 100 are connected to each other, wherein a method of connecting the protrusion 103 and the front bracket 100 comprises, but is not limited to, a detachable connection and a non-detachable connection. Preferably, the protrusion 103 and the front bracket 100 may be integrally molded. Preferably, the protrusion 103 is integrally molded with the front bracket 100, and the material adopted by the protrusion 103 may be consistent with the material of the LED bracket.

In the present disclosure, the diffusion material 400 comprises fluorescent powder or encapsulation glue.

The fluorescent powder or the encapsulation glue both may be used to amplify and reinforce the light transmitted from the front bracket 100, so that the light emitted from the back bracket 200 is not quite different from the light emitted from the front bracket 100 when a product is made.

In one or more embodiments, the front bracket 100 and the back bracket 200 are injection-molded with the same material.

It should be noted that the front bracket 100 and the back bracket 200 both may be made of materials such as wool fabric, PPA, PC, PCT, PP, and polymethyl methacrylate, which are not limited herein.

The LED lamp bead described in the above embodiments is applicable to LED Christmas lamps, LED soft and hard light bars, city lightening, indoor decoration, LED multicolor luminous characters (8 colors), and electrical equipment marquees.

In the present disclosure, unless otherwise specified and defined explicitly, a first feature being "above" or "below" a second feature may include the first feature and the second feature being in direct contact, and also may include the first feature and the second feature being not in direct contact but being in contact through another feature therebetween. Moreover, the first feature being "on", "above" or "over" the second feature comprises the first feature being directly above or not directly above the second feature, or merely means the level of the first feature being higher than that of the second feature. The first feature being "under", "below" or "beneath" the second feature comprises the first feature being directly below or not directly below the second feature, or merely means the level of the first feature being lower than that of the second feature.

In the description of the present description, descriptions with reference to terms such as "an embodiment" and "example" mean that specific features, structures, materials or characteristics described in combination with this embodiment or example are included in at least one embodiment or example of the present disclosure. In the present description, illustrative expression of the above terms does not necessarily refer to the same embodiment or example.

The technical principle of the present disclosure is described in the above with reference to specific embodiments. These descriptions are merely for explaining the principle of the present disclosure, and cannot be interpreted in any way as limiting the scope of protection of the present disclosure. Based on the explanation herein, other specific embodiments of the present disclosure can be conceived by those skilled in the art without involving any inventive effort, and these modes all belong to the scope of protection of the present disclosure.

In an embodiment:

As shown in FIG. 1, the LED bracket comprises the front bracket 100, the back bracket 200, and the substrate 300, the front bracket 100 and the back bracket 200 are connected to each other, the front bracket 100 is provided with the light-transmitting layer 102, two substrates 300 are provided, and the two substrates 300 and the light-transmitting layer 102 are matched and connected; the light-transmitting layer 102 is provided between two substrates 300, the groove 201 is provided in the back bracket 200, and the groove 201 is provided in the middle position of the back bracket 200, and the groove 201 encloses the two substrates 300 and the light-transmitting layer 102 provided between the two substrates 300. The end portions of the two substrates 300 away from the light-transmitting layer 102 are each provided with the weld leg 301, and the protrusion 103 is also provided in the mounting holes on the substrates 300.

As shown in FIG. 2, the mounting groove 101 is provided on the front bracket 100, the mounting groove 101 is provided in the middle position of the front bracket 100, and the mounting groove 101 encloses the two substrates 300 and the light-transmitting layer 102 provided between the two substrates 300.

INDUSTRIAL APPLICABILITY

In the LED bracket in the present disclosure, the front bracket is provided, and the back bracket is additionally provided on the front bracket. The back bracket is provided with the diffusion material, and when the lamp bead is provided on the front bracket, light emitted from the LED lamp chip close to the back bracket can be diffused through the diffusion material, so that effect of light emitted from the back bracket is not quite different from effect of light emitted from the front bracket, thus achieving the characteristic of increasing the light effect of the LED lamp chip on the back bracket.

What is claimed is:

1. A light emitting diode (LED) bracket, comprising:
 a front bracket, wherein a light emitting diode (LED) lamp chip is provided in the front bracket; and
 a back bracket, wherein the back bracket is connected to the front bracket, and a diffusion material is provided on a side of the back bracket away from the front bracket,
 wherein the LED lamp chip is configured to emit light from the front bracket and light emitted in a direction close to the back bracket passes through the diffusion material and then emits from the back bracket, wherein the front bracket has two ends provided opposite to each other, the front bracket is provided with a mounting station, the LED lamp chip is encapsulated on the mounting station, and light emitted from the LED lamp chip is emitted from two opposite ends of the front bracket.

2. The LED bracket according to claim 1, wherein the back bracket is connected to the front bracket in a direction parallel to the front bracket, and an outer diameter of the back bracket is not greater than an outer diameter of the front bracket, both left and right ends of the back bracket is configured to be flush with both left and right ends of the front bracket, and length of upper end and lower end of the back bracket is less than length of upper end and lower end of the front bracket.

3. The LED bracket according to claim 1, wherein the back bracket is provided with a filling station, and the diffusion material is filled in the filling station.

4. The LED bracket according to claim 3, wherein the back bracket is provided with a groove, the groove is recessed in a direction close to the front bracket, and the diffusion material is provided in the groove.

5. The LED bracket according to claim 4, wherein the filling station comprises the groove, the groove is disposed in a middle position of the back bracket, and the groove penetrates through two opposite ends of the back bracket.

6. The LED bracket according to claim 4, wherein the diffusion material is filled in the groove, and the diffusion material fills the groove to be flush with an end surface of the back bracket away from the front bracket.

7. The LED bracket according to claim 4, further comprising substrates, wherein two substrates are provided, the two substrates are provided at intervals, and end portions of the two substrates arranged at the intervals are covered by a light-transmitting layer, end portions of the substrates away from the light-transmitting layer are protrudingly provided on the front bracket in a direction parallel to the back bracket, and the end portions of the substrates are each provided with a weld leg.

8. The LED bracket according to claim 7, wherein the two substrates are distributed vertically and arranged on the front bracket at the intervals, and light, which is emitted from the LED lamp chip closely to the back bracket, passes through a gap between the two substrates.

9. The LED bracket according to claim 7, wherein the LED lamp chip is welded onto the substrates, and the LED lamp chip is encapsulated in a mounting groove by an encapsulation glue.

10. The LED bracket according to claim 7, wherein a matching groove is provided on one side of the front bracket close to the back bracket, the matching groove is recessed in a direction away from the back bracket, and a corresponding substrate is snapped in the matching groove.

11. The LED bracket according to claim 10, wherein an end portion of the matching groove is provided with a protrusion, and the protrusion is provided in a mounting hole of the corresponding substrate, so that the corresponding substrate is snapped in the matching groove.

12. The LED bracket according to claim 10, wherein the LED bracket covers the substrate, and the LED bracket is formed with the matching groove that is snapped with the corresponding substrate.

13. The LED bracket according to claim 1, wherein the front bracket is provided with a mounting groove, the mounting groove is recessed in a direction close to the back bracket, and the LED lamp chip is provided in the mounting groove.

14. The LED bracket according to claim 13, wherein the mounting station comprises the mounting groove, and the mounting groove penetrates through two opposite ends of the front bracket.

15. The LED bracket according to claim 13, wherein a receiving area of the mounting groove is greater than an area of the LED lamp chip.

16. The LED bracket according to claim 13, wherein the front bracket is further provided with a light-transmitting layer, the light-transmitting layer is arranged corresponding to the mounting groove, and light of the LED lamp chip passes through the light-transmitting layer and emit from the back bracket.

17. The LED bracket according to claim 16, wherein the light-transmitting layer is made of material same as the front bracket, and an end portion of the light-transmitting layer and the front bracket are integrally molded.

18. The LED bracket according to claim 1, wherein the diffusion material comprises fluorescent powder or encapsulation glue.

19. The LED bracket according to claim 1, wherein the front bracket and the back bracket are injection-molded using same material.

* * * * *